(12) United States Patent
Hadji-Abdolhamid et al.

(10) Patent No.: US 10,014,888 B2
(45) Date of Patent: Jul. 3, 2018

(54) JITTER IMPROVEMENT IN SERIALIZER-DESERIALIZER (SERDES) TRANSMITTERS

(71) Applicant: MaxLinear, Inc., Carlsbad, CA (US)

(72) Inventors: Amir Hadji-Abdolhamid, Carlsbad, CA (US); Sheng Ye, Carlsbad, CA (US)

(73) Assignee: MAXLINEAR, INC., Carlsbad, CA (US)

( * ) Notice: Subject to any disclaimer, the term of this patent is extended or adjusted under 35 U.S.C. 154(b) by 0 days.

(21) Appl. No.: 15/177,018

(22) Filed: Jun. 8, 2016

(65) Prior Publication Data

US 2016/0359508 A1     Dec. 8, 2016

Related U.S. Application Data

(60) Provisional application No. 62/172,532, filed on Jun. 8, 2015.

(51) Int. Cl.
| | |
|---|---|
| H04K 1/02 | (2006.01) |
| H04B 1/04 | (2006.01) |
| H04B 15/02 | (2006.01) |
| H03K 3/01 | (2006.01) |
| H03M 9/00 | (2006.01) |
| H04B 1/717 | (2011.01) |

(52) U.S. Cl.
CPC .......... *H04B 1/0475* (2013.01); *H04B 15/02* (2013.01); *H03K 3/01* (2013.01); *H03M 9/00* (2013.01); *H04B 1/7174* (2013.01)

(58) Field of Classification Search
CPC .......... H03K 3/01; H03M 9/00; H04B 1/7174
USPC ......................................................... 375/296
See application file for complete search history.

(56) References Cited

U.S. PATENT DOCUMENTS

| | | | | |
|---|---|---|---|---|
| 2008/0122546 A1* | 5/2008 | Shiramizu | ............ | H03K 3/0322 331/34 |
| 2009/0046784 A1* | 2/2009 | Tsukamoto | .......... | G06F 13/4291 375/247 |

* cited by examiner

*Primary Examiner* — Leila Malek
(74) *Attorney, Agent, or Firm* — McAndrews, Held & Malloy, Ltd.

(57) ABSTRACT

Systems and methods are provided for jitter improvement in serializer-deserializer (SerDes) transmitters. One or more adjustments may be applied in SerDes transmitter circuitry to reduce jitter in a serial output of the SerDes transmitter circuitry, which may occur as a result of processing of input data. Applying the one or more adjustments may comprise use of dummy data. The dummy data may be configured to generate corresponding dummy current pulses which may in turn be used in controlling supply variations occurring during processing of the input data and/or generation of the serial output. The dummy data may be configured to generate the dummy current pulses such that they are applied along with current pulses corresponding to the input data. The dummy data may be adaptively set or adjusted based on the input data. The use of the dummy data may be selectively turned on or off.

4 Claims, 9 Drawing Sheets

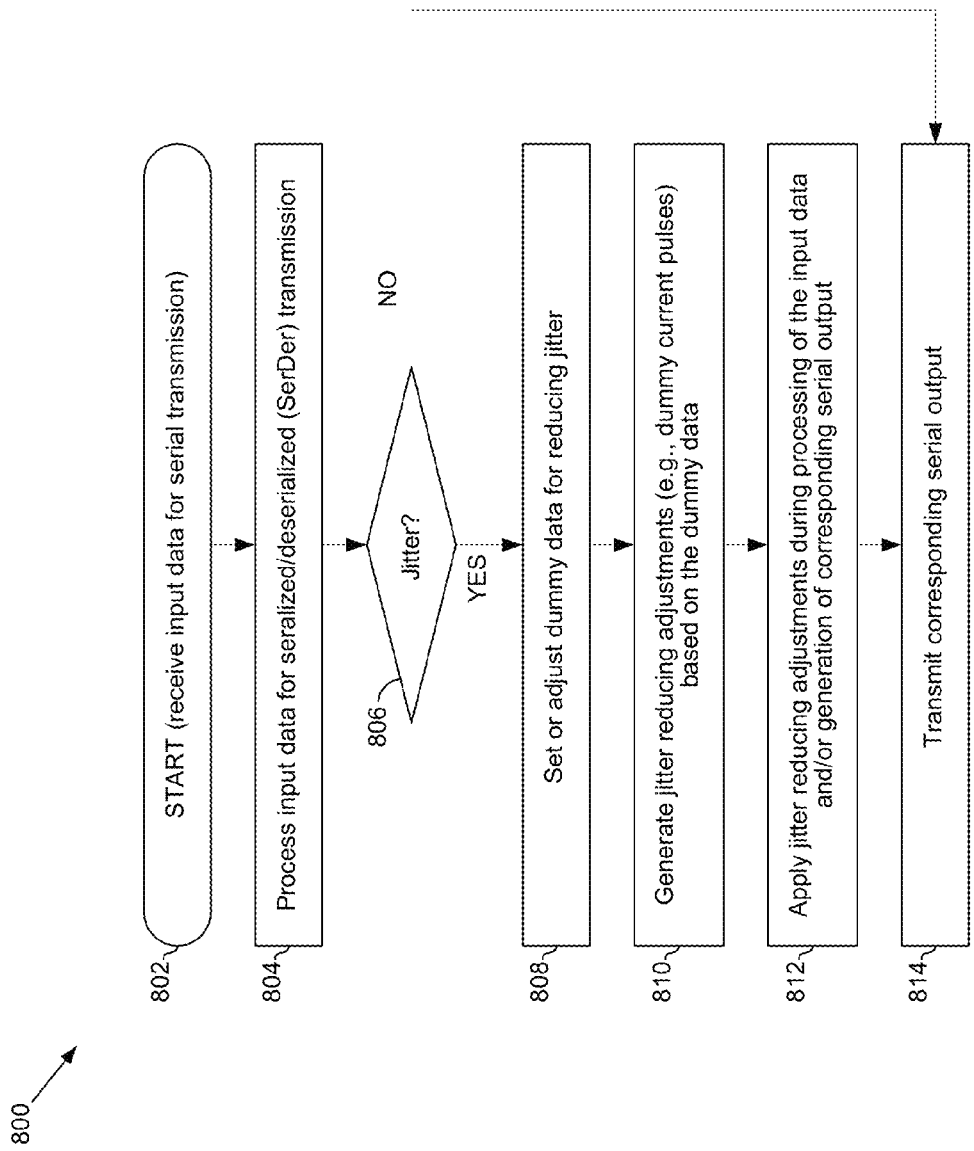

JITTER IMPROVEMENT IN SERIALIZER-DESERIALIZER (SERDES) TRANSMITTERS

CLAIM OF PRIORITY

This patent application makes reference to, claims priority to and claims benefit from U.S. Provisional Patent Application Ser. No. 62/172,532, filed Jun. 8, 2015. The identified application is hereby incorporated herein by reference in its entirety.

TECHNICAL FIELD

Aspects of the present disclosure relate to signal processing. More specifically, various implementations of the present disclosure relate to jitter improvement in serializer-deserializer (SerDes) transmitters.

BACKGROUND

Conventional approaches for handling jitter in transmitters (e.g., serializer-deserializer (SerDes) transmitters), may be costly, cumbersome, or inefficient—e.g., they may be complex and/or time consuming, require considerable power, and/or may introduce errors or distortion. Further limitations and disadvantages of conventional and traditional approaches will become apparent to one of skill in the art, through comparison of such systems with some aspects of the present disclosure as set forth in the remainder of the present application with reference to the drawings.

BRIEF SUMMARY

System and methods are provided for jitter improvement in serializer-deserializer (SerDes) transmitters, substantially as shown in and/or described in connection with at least one of the figures, as set forth more completely in the claims.

These and other advantages, aspects and novel features of the present disclosure, as well as details of an illustrated embodiment thereof, will be more fully understood from the following description and drawings.

BRIEF DESCRIPTION OF SEVERAL VIEWS OF THE DRAWINGS

FIG. 8 illustrates a flowchart of an example process for handling jitter improvement in serializer-deserializer (SerDes) transmitters.

DETAILED DESCRIPTION OF THE INVENTION

As utilized herein the terms "circuits" and "circuitry" refer to physical electronic components (e.g., hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y." As another example, "x, y, and/or z" means any element of the seven-element set {(x), (y), (z), (x, y), (x, z), (y, z), (x, y, z)}. In other words, "x, y and/or z" means "one or more of x, y, and z." As utilized herein, the term "exemplary" means serving as a non-limiting example, instance, or illustration. As utilized herein, the terms "for example" and "e.g.," set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

Figure 1:
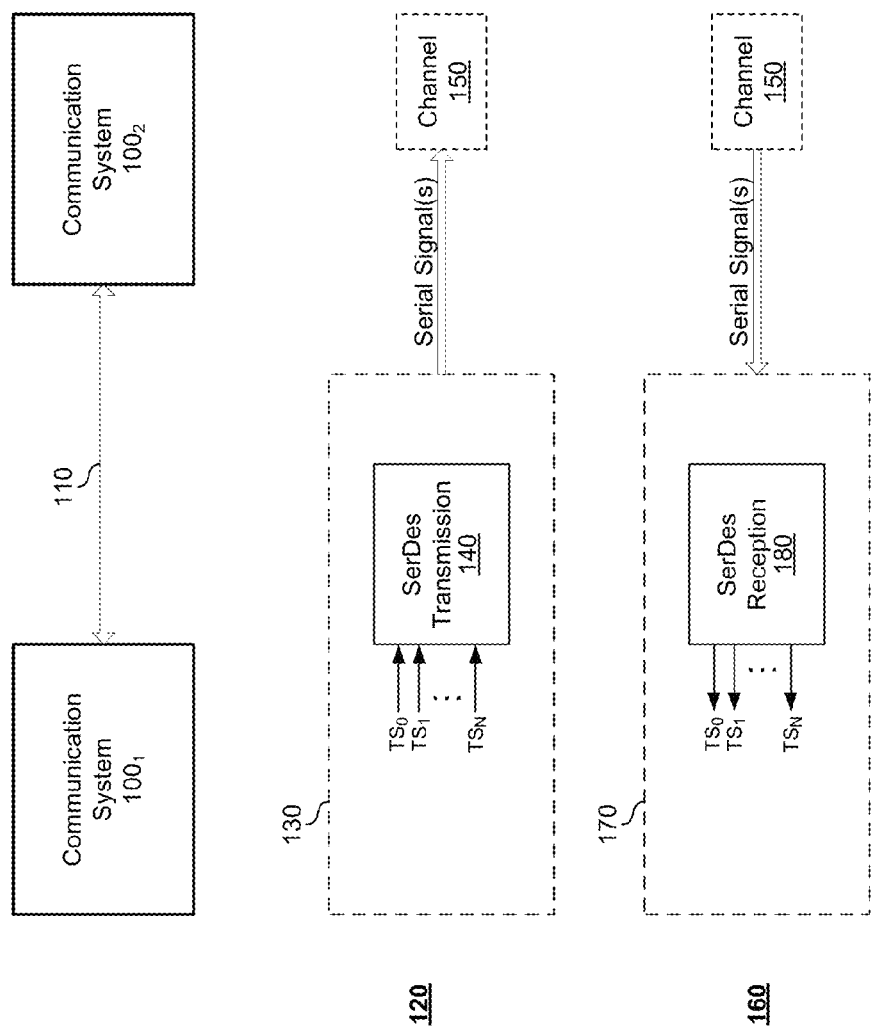
FIG. 1 illustrates an example communication setup in which serializer-deserializer (SerDes) based transmissions may be used.

FIG. 1 illustrates an example communication setup in which serializer-deserializer (SerDes) based transmissions may be used. Shown in FIG. 1 is a communication setup 100, comprising communication systems $110_1$ and $110_2$, which may communicate with one another (e.g., via a connection/link 111).

Each of the communication systems $110_1$ and $110_2$ may comprise suitable circuitry for implementing various aspects of the present disclosure. In particular, each of communication systems $110_1$ and $110_2$ may be configured for communication of data, over wired and/or wireless connections, such as during executing, running, and/or performing of operations, functions, applications and/or services supported by the communication systems $110_1$ and $110_2$. In this regard, the communication systems $110_1$ and $110_2$ may support a plurality of wired and/or wireless interfaces and/or protocols, and may be operable to perform necessary processing operations to facilitate transmission and/or reception of signals (e.g., RF signals) over supported wired and/or wireless interfaces.

In some instances, the communication systems $110_1$ and $110_2$ may be two separate electronic devices (or components thereof). Examples of electronic devices may comprise cellular and smart phones or similar handheld devices, tablets, personal computers, laptops or notebook computers, servers, personal media players, personal digital assistants, set top boxes, satellite receivers, wireless access points, cellular base stations, etc. In other instances, the communication systems $110_1$ and $110_2$ may be components within the same electronic device (e.g., blocks configured to communicate with one another via particular internal interface). The disclosure is not limited, however, to any particular type of communication systems, and the various implementation described in this disclosure may apply to any electronic platform which may be operable to communicate (transmit and/or receive) signals.

Examples of wireless standards, protocols, and/or interfaces which may be supported and/or used by the communication systems $110_1$ and $110_2$ for communication therebetween may comprise wireless personal area network (WPAN) protocols, such as Bluetooth (IEEE 802.15); near field communication (NFC) standards; wireless local area network (WLAN) protocols, such as WiFi (IEEE 802.11); cellular standards, such as 2G/2G+ (e.g., GSM/GPRS/EDGE, and IS-95 or cdmaOne) and/or 2G/2G+ (e.g., CDMA2000, UMTS, and HSPA); 4G standards, such as WiMAX (IEEE 802.16) and LTE, Ultra-Wideband (UWB), Extremely High Frequency (EHF, such as 60 GHz); Digital TV Standards (e.g., DVB-T/DVB-H, and ISDB-T), etc.

Examples of wireless standards, protocols, and/or interfaces which may be supported and/or used by the communication systems $110_1$ and $110_2$ for communication therebetween may comprise Ethernet (IEEE 802.3), Digital Subscriber Line (DSL), Integrated Services Digital Network (ISDN), Fiber Distributed Data Interface (FDDI), cable television and/or internet access standards (e.g., ATSC, DVB-C, DOCSIS, etc.), in-home distribution standards such as Multimedia over Coax Alliance (MoCA), Universal Serial Bus (USB) based standards/protocols/interfaces, etc.

In operation, the communication systems $110_1$ and $110_2$ may communicate with each other, such as via one or more connections and/or links (e.g., the connection/link 111). The communications between the communication systems $110_1$ and $110_2$, over the connection/link 111, may comprise transmission and reception of signals, which may be utilized to carry data exchanged between the communication systems $110_1$ and $110_2$. The signals communicated over the connection/link 111 may be setup, configured, and/or utilized in accordance with particular wired and/or wireless interfaces, protocols or standards. In this regard, the communication systems $110_1$ and $110_2$ may comprise suitable components (e.g., circuitry, other hardware, etc.) configured to perform various functions or operations required to facilitate the transmission and reception of signals.

The communications between the communication systems $110_1$ and $110_2$ may be performed and/or carried out in different ways. For example, communications may be done using serializer/deserializer (SerDes) based transmissions, which may be used to enable or support high speed communications. Use of SerDes transmissions may enable optimizing such high speed communications, by allowing compensation for limited input/output. In particular, with SerDes based transmissions, multiple streams may be combined into and transmitted over a single serial channel at the transmit-side, and the single serial channel may then be handled at the receive-side in manner that allows extracting the multiple streams from signals transmitted over the serial channel.

The communication systems $110_1$ and $110_2$ may comprise suitable components (e.g., circuitry, other hardware, etc.) and/or may incorporate functions needed to facilitate and/or enable SerDes based communications. For example, supporting SerDes may require performing PISO (parallel in serial out) processing at the transmit-side, and SIPO (serial in parallel out) processing at the receive-side, to enable converting data between serial data and parallel interfaces in each direction. A simplified SerDes transmission and reception model is illustrated in FIG. 1.

At the transmit-side 120, a transmission (Tx) processing path 130 for handling transmission operations. The Tx processing path 130 may comprise suitable circuitry for generating signals for transmission, such as based on input data that is intended to be carried and/or embedded in the communicated signals. In particular, the Tx processing path 130 may be configured to support SerDes transmissions. For example, the Tx processing path 130 may comprise a SerDes transmission circuit 140. The SerDes transmission circuit 140 may be combine a plurality of inputs (e.g., transport streams $TS_0$-$TS_N$, where N is an integer greater than 1) onto signals configured for transmission over a single serial channel 150. For example, the SerDes transmission circuit 140 may encapsulates packets of the plurality of transport streams $TS_0$-$TS_N$ into frames of a serial datastream, and may then push these frames over the channel 150. Thus, the SerDes transmission circuit 140 may provide the PISO function at the transmit-side 120. An example implementation of a SerDes based transmitter is described in more detail with respect to FIG. 2.

At the receive-side 160, a reception (Rx) processing path 180 may be used in handling reception of the signals. The reception (Rx) processing path 180 may comprise suitable circuitry for receiving and processing signals, such as to extract data carried and/or embedded therein (e.g., the data embedded into the signals at the transmit-side 120). In particular, the Rx processing path 170 may be configured to support SerDes transmissions. For example, the Rx processing path 170 may comprise a SerDes reception circuit 180. The SerDes reception circuit 180 may extract from serial signals (signals communicated over the serial channel 150) a plurality of outputs, corresponding to the plurality of inputs (e.g., transport streams) combined into the signals at the transmit-side 120. For example, the SerDes transmission circuit 140 may process the frames of the serial datastream (generated at the transmit-side 120), and may process them to recover the packets of one or more of the transport streams $TS_0$-$TS_N$, and may then push these frames over the channel 150. Thus, the SerDes reception circuit 180 may provide the SIPO function at the receive-side 160.

In some instances, performance relating to communications and/or to operations, functions, and/or components used therefor may need to be improved, such as by accounting for and/or handling (e.g., mitigating, etc.) possible conditions or effects thereof that may degrade performance. For example, with SerDes based communications, jitter may be introduced at the transmit-side. Jitter may result from deviations in data transition edges from ideal periodic signal edges (e.g., based on clock signals). In this regard, jitter may be introduced into the transmission due to, for example, particular patterns in input data.

Accordingly, in various implementations in accordance with the present disclosure, communication systems (or components thereof) may be implemented to improve jitter performance. This may be achieved, for example, by controlling certain transmitter functions (e.g., transitions based on clock signals) which may introduce jitter and/or may be particularly susceptible to conditions that may cause jitter. Nonetheless, while the implementations described herein are with respect to SerDes transmissions, various aspects of the present disclosure may apply in substantially similar manner to other types of serial transmissions.

Figure 2:
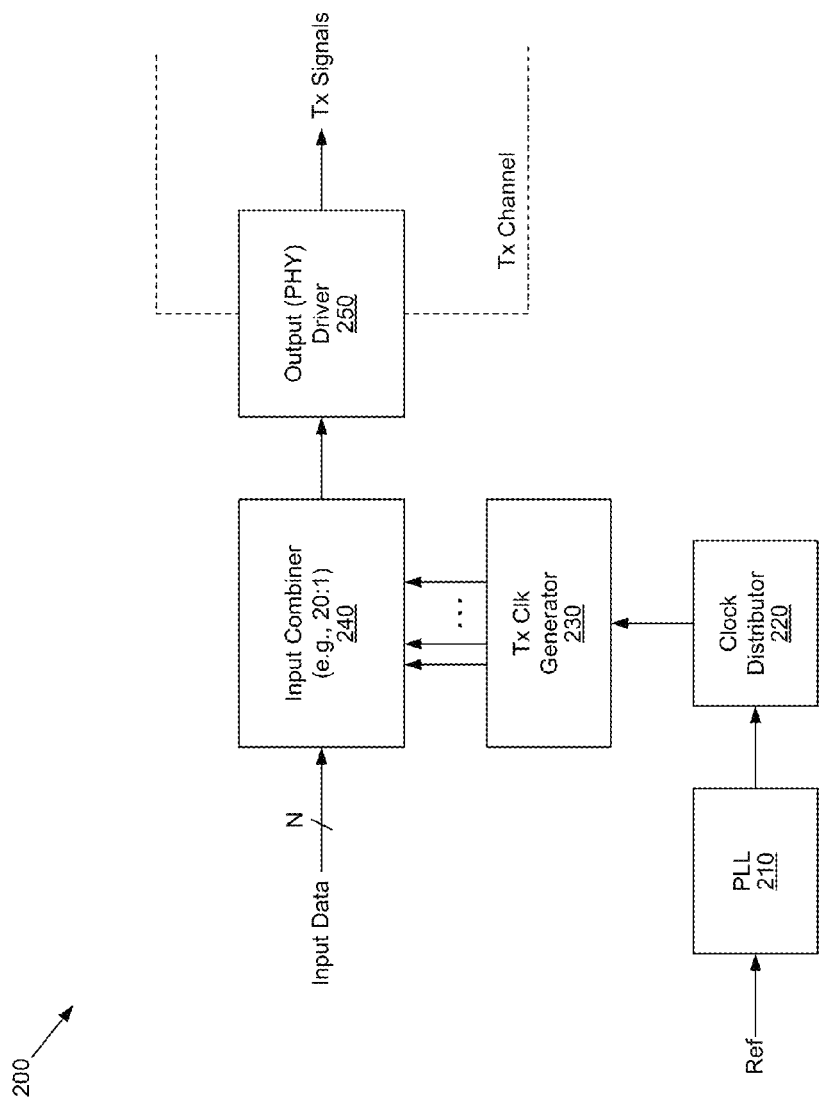
FIG. 2 illustrates an example serializer-deserializer (SerDes) transmitter.

FIG. 2 illustrates an example serializer-deserializer (SerDes) transmitter. Shown in FIG. 2 is a serializer-deserializer (SerDes) based transmitter 200.

The transmitter 200 may comprise suitable circuitry for transmitting signals. In particular the transmitter 200 may be operable to support and/or facilitate serializer-deserializer (SerDes) based transmission. In the example implementation shown in FIG. 2, the transmitter 200 (or at least a portion thereof associated with SerDes transmissions) may comprise a phase-locked loop (PLL) 210, a clock distributer 220, a transmission (Tx) clock generator 230, an input combiner 240, and an output (physical layer or PHY) driver 250.

In operation, the transmitter 200 may support SerDes transmissions. For instance, the transmitter 200 may function as a high speed data interface, providing high speed data handling between an external serial link (or channel therein) and other components (e.g., within a system comprising the transmitter 200, such as core blocks inside communication chips). The input combiner 240 may combine, for example, a plurality (e.g., 20 in the example shown in FIG. 2) of separate inputs (e.g., transport streams) onto a single serial stream (thus providing 20:1 combining), which may be embedded into, via the output/PHY driver 250, transmission signals generated and/or configured for transmission over a serial channel.

The combining of input data via the input combiner 240 may be controlled using a plurality clocking signals that are provided by the Tx clock generator 230, which generate the transmission control clock signals based on the clocking input that the clock distributer 220 may generate using the output signal of the PLL 210.

In some instances, the performance of the transmitter 200 may be affected by and/or correspondingly measured based on various conditions, criteria, and/or parameters. For example, one performance criterion of serial transmissions (or data output corresponding thereto) may be the jitter performance of the output serial data. This may be because, as noted above, jitter may occur during SerDes transmissions. In this regard, jitter may be introduced during SerDes by certain components (or functions associated therewith) used in facilitate SerDes transmission. For example, jitter may be introduced due to misalignment (e.g., deviations) in data transition edges compared to ideal periodic signal edges (e.g., the clock signals). For example, particular patterns in input data may result in introduction of jitter may be introduced into the SerDes transmission. This is explained in more detail with respect to FIGS. 3A and 3B.

Accordingly, the transmitter 200 may be configured to reduce jitter. This may be done by, for example, introducing various adjustments during generation and/or processing of transmitted signals to reduce jitter. In an example implementation, this may be done by adaptively generating and incorporating dummy pulses to counteract conditions that may produce jitter, as explained in more details below.

Figure 3A:
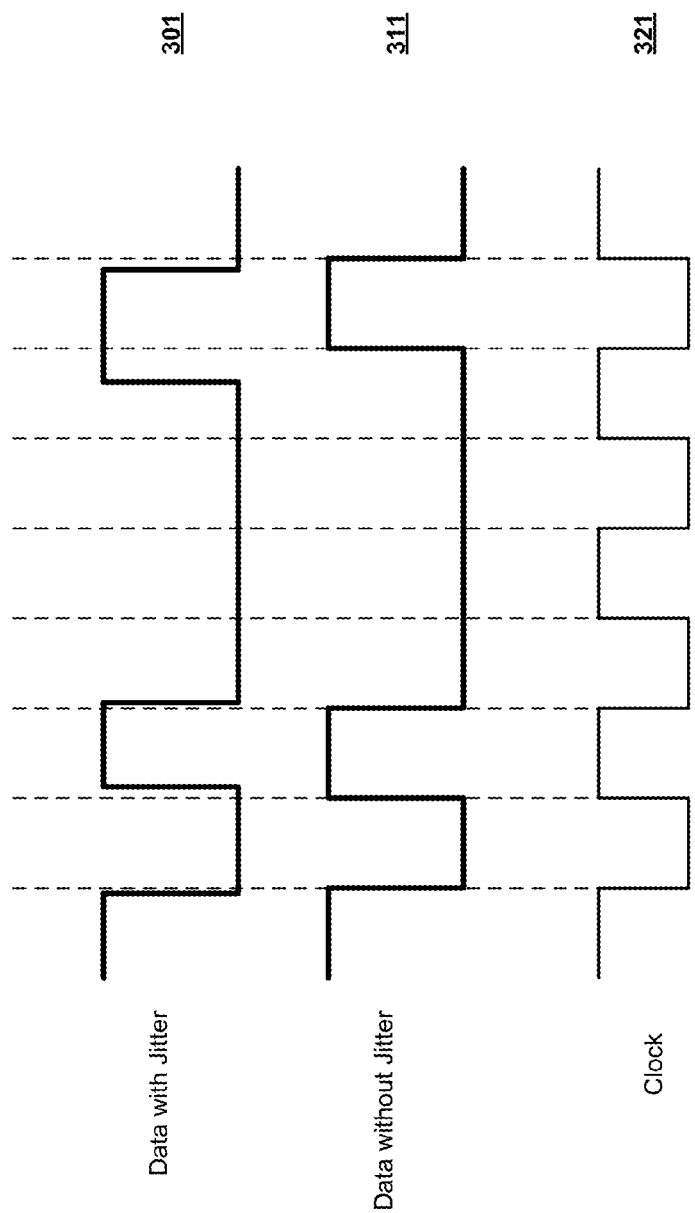
FIG. 3A is a timing chart illustrating example of introduction of jitter in data during operations in a serializer-deserializer (SerDes) transmitter.

FIG. 3A is a timing chart illustrating example of introduction of jitter in data during operations in a serializer-deserializer (SerDes) transmitter. Shown in FIG. 3A are timing charts 301 and 311, which correspond to, respectively, data without jitter and data with jitter.

As shown in timing charts 301 and 311 of FIG. 3A, jitter may sometimes be introduced (e.g., onto output data of a SerDes transmitter). In this regard, as noted above, jitter may be introduced as result of deviations in data transition edges relative to edges of an ideal periodic signal (e.g., a clock signal 321) driving the component generating the output data. Thus, as illustrated in FIG. 3A, while the edges of the data without jitter align with the edges of the clock signal 321, the edges of the data with jitter do not. The deviations in transition edges may be introduced due to various reasons and/or conditions. For example, data transition instances may be disturbed when threshold voltage of a data buffer is disturbed, or when the clock edge of the final sampling flip flop of the data is disturbed by itself.

These disturbances in turn may be caused by, for example, noise in the system (as a whole), or the clock generator circuits by itself. One main source of jitter, however, is the noise and glitches on the power supply and ground affecting the data transition time instants during all data buffering and also disturbing the clock signal 321 that lastly samples the data before transmission. As data is generally random, most of the variations may be correlated to data randomness to some extent. Thus, variations on the supply and ground which will be highly correlated with data will cause a data dependent jitter which is undesirable.

Figure 3B:
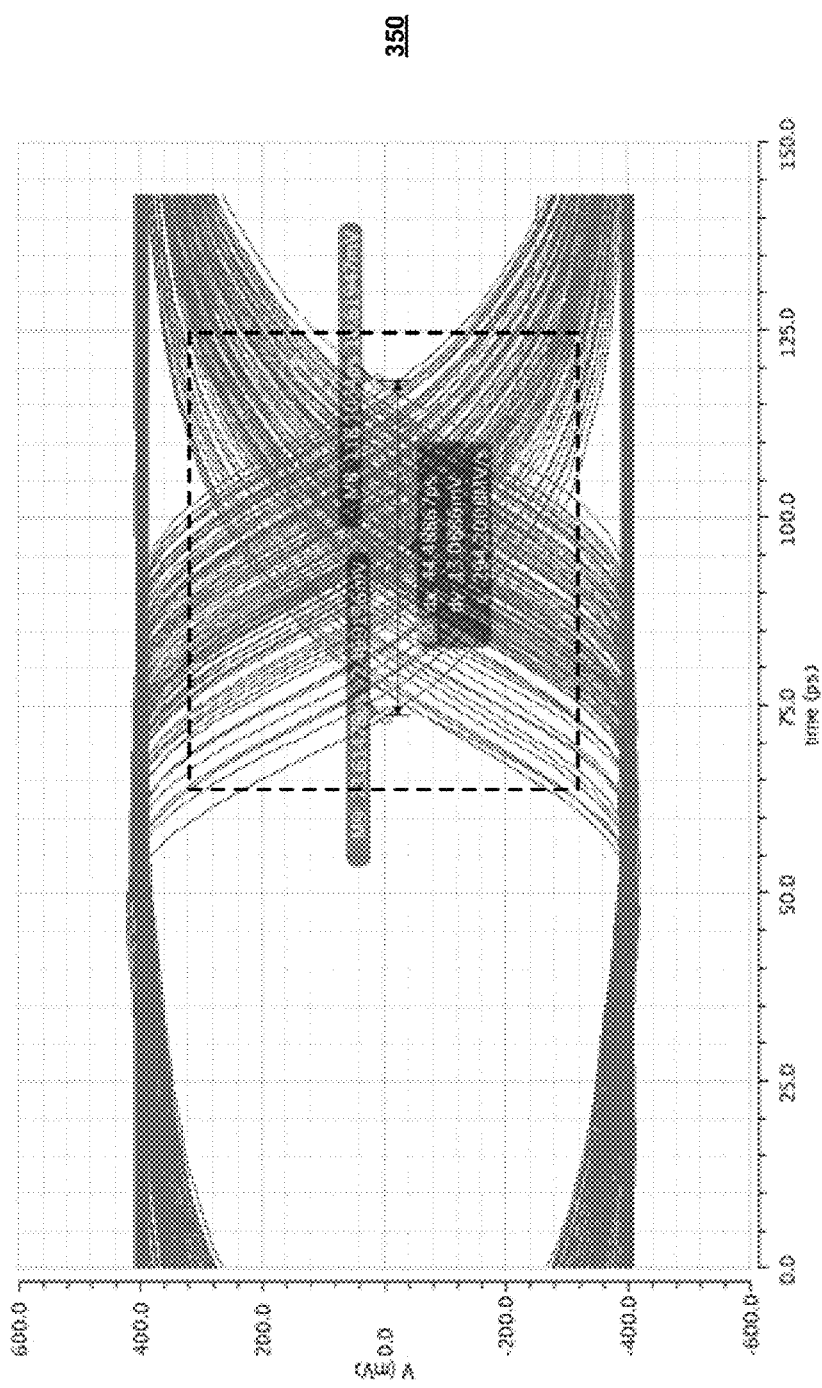
FIG. 3B illustrates occurrence of jitter in data as tracked during example serializer-deserializer (SerDes) based transmissions.

FIG. 3B illustrates occurrence of jitter in data as tracked during example serializer-deserializer (SerDes) based transmissions. Shown in FIG. 3B is a chart 350 representing trace of SerDes transmission in which jitter (in the area highlighted using the dashed box) occurred. In this regard, as noted above, with occurrence of the jitter, transition edges of various portions of the output data may deviate during generation of the output data.

Such jitter related issues may be addressed, in various implementations in accordance with the present disclosure, by configuring communication systems (or components thereof) to account for and mitigate jitter, thus improving overall jitter performance. This may be achieved, for example, by controlling certain transmitter functions (e.g., transitions based on clock signals), which may introduce jitter and/or may be particularly susceptible to conditions that may cause jitter. For example, in certain example implementations, SerDes based transmitters (or components) thereof may be configured to mitigate and/or eliminate jitter introduce due to variations in, for example, supply and/or ground within the transmitter. In this regard, variations in supply (or ground) in SerDes transmitter may come from current pulses with random time instances. Thus, eliminating such variations (or making the variation constant) may reduce or eliminate jitter that would otherwise be introduced due to such variations.

In an example implementation, variations on the supply or ground in a SerDes transmitter (e.g., transmitter 200 of FIG. 2) may be reduced by adding dummy current pulses, such as at times when there is no current supply (in accordance with the data pattern being processed for SerDes transmission). This is explained in more detail with respect to FIG. 4.

Figure 4:
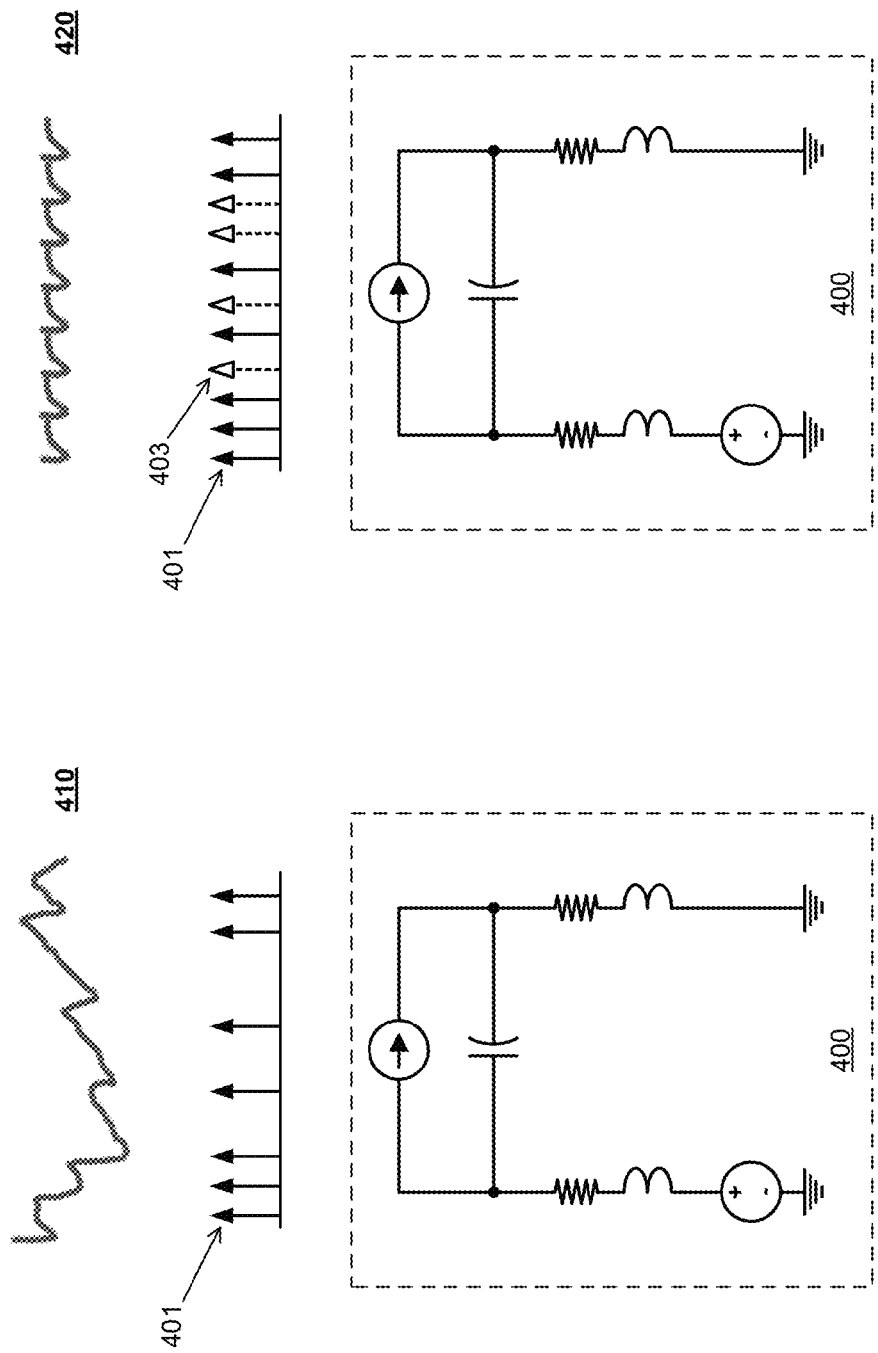
FIG. 4 illustrates example use of dummy current pulses to minimize data-dependent supply variations in a serializer-deserializer (SerDes) transmitter.

FIG. 4 illustrates example use of dummy current pulses to minimize data-dependent supply variations in a serializer-deserializer (SerDes) transmitter. Shown in FIG. 4 is a supply circuit 400.

The supply circuit 400 may be operable to supply current pulses, such as based on input data. For example the supply circuit 400 may be used to support SerDes transmissions (e.g., being incorporated into a SerDes transmitter, such as transmitter 200, or particular component thereof, such as the input combiner 240). In this regard, the supply circuit 400 may be operable to supply current pulses based on data that is being processed for transmission. Further, the supply circuit 400 may be configured for reducing jitter during data transmission (e.g., SerDes transmissions).

In this regard, as illustrated in use scenario 410 representing a normal mode of operation (e.g., without any adjustments to counter jitter), variations on supply (or ground) may be introduced because of current pulses 401, corresponding to the data, with random time instances. In other words, with a normal mode of operation, supply variations would be data-dependent. In use scenario 420, however, representing an improved mode of operation (e.g., transmission with jitter improvement), variations on the supply or ground may be reduced by adding dummy current pulses 403, such as at times when there are no current pulses 401 (due to lack of current supply, based on the data pattern being processed for SerDes transmission). Thus, in an improved mode of operation, supply variations may be minimized by adding dummy current pulses resulting in constant overall current supply profile (including current pulses due to random data transitions along with dummy current pulses).

The digital data that is used in transmissions is typically in binary form, comprising a series of 1's and 0's. In some instances, data with particular patterns (e.g., long sequence(s) of zeros or ones) may cause jitter in the transmission, especially in circuits (e.g., single ended circuits, pseudo-differential circuit, etc.) that may be particularly sensitive to the supply and variations thereof. In such situations, the kick to the supply voltage may be dependent on the data being transmitted. In this regard, long sequences of 0's (or 1's) may result in low frequency modulation. Because of a finite amount of supply rejection, the supply bounces may come back to modulate the zero crossings. The use of dummy current pulses, however, may result in constant switching, to make the kick to the supply independent of the data pattern. Thus, in situations where there is missing current pulses (as shown in 410), the supply may bounce in an irregular fashion. Adding the dummy current pulses, however, may ensure the supply is kicked every time (as shown in 420). Thus, as far as "controlling" the supply, the system operates as if it is constantly handling (transmitting) data with consistent patter (e.g., 10101010 . . . ).

Accordingly, complete periodic current pulses may be applied on the supply; thus, a constant average current through bond wire may be used—e.g., to charge the decoupling capacitor to compensate for the charge consumption in every current pulse. In other words, by ensuring constant current from power supply and bond wire, there may be no variation on the supply of the circuit.

Figure 6:
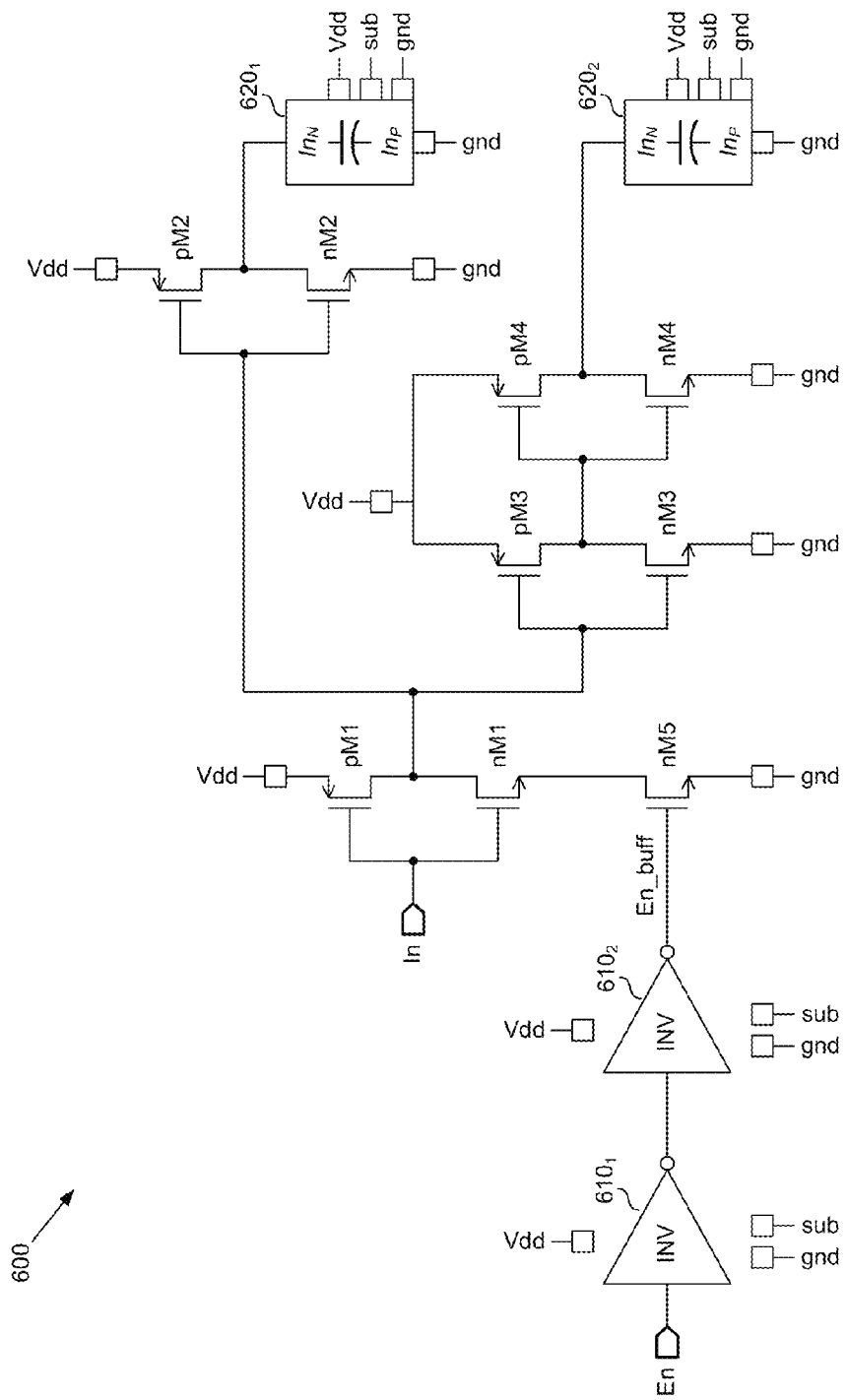
FIG. 6 illustrates an example circuit for providing dummy current pulses in a serializer-deserializer (SerDes) transmitter.

In some example implementations, programmable dummy cells may be used, to provide adjustable (e.g., desirable) amplitude for the dummy current pulses. An example implementation of a circuit with dummy load cells for dummy current pulses is illustrated in FIG. 6, described below.

In some example implementations, dedicated clocking may be used to improve jitter performance. For example, a completely separate clock supply may be used—e.g., as separate supply pin and bond wire for a last sampling flop-flop and its clock generation circuits. Doing so may enable minimizing clock edge dependency on data signal and its supply affection.

In some example implementations, dummy data may be generated and used in controlling the jitter improvement functions (e.g., in controlling the generation of dummy current pulses). In this regard, the dummy data may be generated adaptively based on the data being processed (e.g., transmitted). For example, the dummy data may be generated such that it may have "complementary" pattern—that is, a pattern that is needed to provide the constant supply based on the pattern of the processed data. An example of adaptive generation of dummy data is described with respect to FIG. 5.

In some example implementations, functions used in conjunction with jitter improvement may be used selectively. In this regard, it may be desirable to turn off these functions, for example, to reduce processing and/or power consumption. For example, generation of dummy pulses (and/or dummy data used in controlling such generation) may be selectively turned on or off. Various means may be used to do so—that is, turning the function on or off. For example, with respect to jitter-improvement functions, data and/or the coding used may be turned on or off—e.g., turning these functions on when there is sufficient probability of long strings of 1's (or 0's) in a row; and turning the functions off otherwise. The jitter-improvement functions may also be controlled (turned on or off) based on feedback from a receiver. For example, the transmitter and the receiver may setup communication for exchange of control information (e.g., using out-of-band signaling). The receiver may then notify the transmitter that jitter is not detected (or is within acceptable ranges) at the receiver, thus obviating the need to apply the jitter-improving functions at the transmitter.

In some example implementations, functions used in conjunction with jitter improvement may be configured adaptively, such as to accommodate emerging transmission techniques and/or technologies (e.g., use of newer or new modulation schemes, such as, for example, PAM-4). For example, when using a modulation scheme such as PAM-4 (where there may be plurality of amplitude levels), the jitter-improvement functions may be adapted to account for that aspect. In this regard, the transmitter may be configured to ensure that the supply bump is independent of the level transitions (e.g., regardless of transitions from level 1 to level 2, or level 1 to level 3 or level 4, etc.). The transmitter, again, may be configured such that it always appears (with respect to supply and variations therein) like it is going through the same transitions (e.g., level 0 to level 1, or level 0 to level 2, etc.). In one particular example implementation, the biggest bump may be first identified and selected, and all other transitions may then be configured (e.g., by generating suitable corresponding dummy data) to appear like the selected transition.

Figure 5:
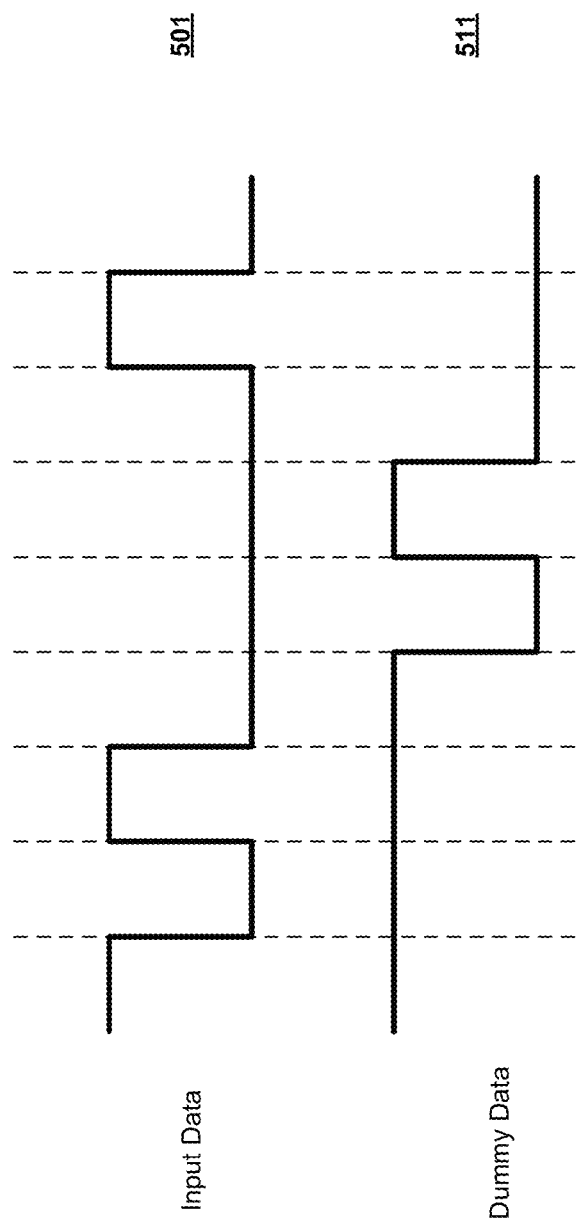
FIG. 5 is a timing diagram for example dummy data that may be used in minimizing jitter in a serializer-deserializer (SerDes) transmitter.

FIG. 5 is a timing diagram for example dummy data that may be used in minimizing jitter in a serializer-deserializer (SerDes) transmitter. Shown in FIG. 5 are timing charts 501 and 511, which correspond to, respectively, the main data (e.g., processed or generated for transmission) and dummy data (e.g., used in triggering dummy current pulses).

The dummy data, represented by timing chart 511, may be generated and/or used to support or enable jitter improvements during SerDes transmissions. In this regard, the dummy data may be used, for example, in controlling triggering and/or generation of dummy current pulses. The dummy data may be generated and/or adjusted based on the main data, represented by timing chart 501, which is processed during the SerDes transmissions. For example, the dummy data may be configured to ensure that dummy current pulses are generated or triggered during period(s) that would otherwise cause supply (or ground) variations.

In an example implementation, generating the dummy data may comprise inverting even main data and keeping the odd data, and serializing them (e.g., using a Mux) to create dummy data, since odd and even data (main data) is available at last stage of serialization (e.g., in a serializer block of the transmitter). Based on such approach, and with main data with a timing profile depicted in timing chart 501, the resultant dummy data has the timing profile depicted in timing chart 511. In another example implementation, the main data may be XOR'ed with another control signal (e.g., clock/2) to create dummy data.

FIG. 6 illustrates an example circuit for providing dummy current pulses in a serializer-deserializer (SerDes) transmitter. Shown in FIG. 6 is a circuit 600.

The circuit 600 may be operable to provide dummy current pulses in programmable, configurable, and/or adjustable manner. For example, the circuit 600 may be operable to provide programmable and/or adjustable amplitude for the dummy current pulses. The circuit 600 may comprise dummy load cells for use in generating or controlling the dummy current pulses.

In the example implementation shown in FIG. 6, the circuit 600 may comprise a plurality of n-channel MOSFET transistors (e.g., nM1-nM5), a plurality of p-channel MOSFET transistors (e.g., pM1-pM4), a pair of inverters $610_1$ and $610_2$, and a pair MOS capacitor (MOSCap) unit cells $620_1$ and $620_2$, which may be arranged in the particular manner depicted in FIG. 6. In this regard, the MOSCap unit cells $620_1$ and $620_2$ may be used to program the load and complementary dummy current spikes. The cells may be used, for example, in a binary format for both the clock and Tx drivers supply domains (emphasized on driver supply).

Figure 7:
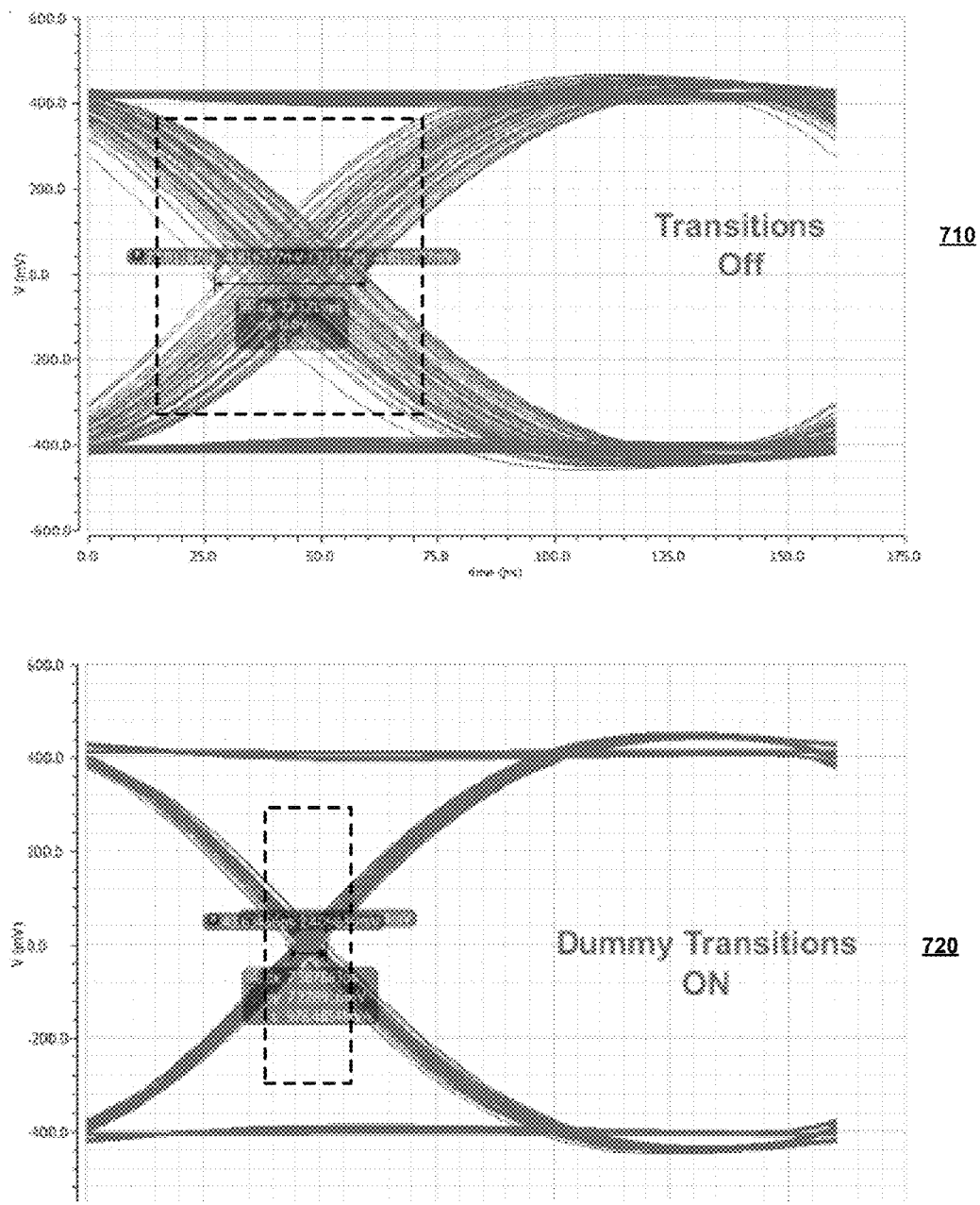
FIG. 7 illustrates example improvement from use of dummy transitions in a serializer-deserializer (SerDes) transmitter.

FIG. 7 illustrates example improvement from use of dummy transitions in a serializer-deserializer (SerDes) transmitter. Shown in FIG. 7 are charts 710 and 720, illustrating, respectively, traces of example SerDes transmissions of the same data with dummy transitions off (that is not used) in chart 710 and with dummy transitions on (that is used) in chart 720.

As charts 710 and 720 illustrate, using dummy transitions (e.g., to reduce or eliminate supply variations) results in significant jitter improvement, as illustrated by the substantial reduction in jitter in the corresponding output data.

FIG. 8 illustrates a flowchart of an example process for handling jitter improvement in serializer-deserializer (SerDes) transmitters. Shown in FIG. 8 is flow chart 800, comprising a plurality of example steps (represented as blocks 802-814), for handling jitter improvement in serializer-deserializer (SerDes) transmitters (e.g., system 200 of FIG. 2), in accordance with the present disclosure.

In starting step 802, input data for serial transmission may be received.

In step 804, the input data may be processed for serialized/deserialized (SerDer) transmission, as described above.

In step 806, it may be determined whether jitter may occur. In this regard, the determination of jitter may be done after serial output is generated based on the processing of input data, after at least some of the processing is performed, or before any processing. The pre-processing determination may be based on, for example, pre-defined criteria (e.g., particular patterns or bit sequences in the input data). The determination of whether the jitter may occur (or not) may allow selectively foregoing application of any jitter reduction measures. Thus, where it is determined that no jitter occurs, the process may jump directly to step 814; otherwise, the process may proceed to step 808. Nonetheless, in some instances the jitter reductions may be always performed, and as such this step may be skipped.

In step 808, dummy data may be set and/or adjusted, such as adaptively based on the input data, as described above.

In step 810, jitter reducing adjustments (e.g., dummy current pulses) may be generated based on the dummy data.

In step 812, the jitter reducing adjustments may be applied, such during processing of the input data and/or generation of corresponding serial output.

In step 814, the serial output may be transmitted.

Other embodiments of the invention may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the processes as described herein.

Accordingly, various embodiments in accordance with the present invention may be realized in hardware, software, or a combination of hardware and software. The present invention may be realized in a centralized fashion in at least one computing system, or in a distributed fashion where different elements are spread across several interconnected computing systems. Any kind of computing system or other apparatus adapted for carrying out the methods described herein is suited. A typical combination of hardware and software may be a general-purpose computing system with a program or other code that, when being loaded and executed, controls the computing system such that it carries out the methods described herein. Another typical implementation may comprise an application specific integrated circuit or chip.

Various embodiments in accordance with the present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A system comprising:
 a pulse generation circuit configured for generating programmable and adjustable dummy current pulses for use in serializer/deserializer (SerDes) transmitters, wherein the pulse generation circuit comprises:
  one or more dummy load cells, wherein each dummy load cell is configurable to program load and complementary dummy current spikes; and
  one or more control elements for controlling the one or more dummy load cells based on one or more input signals to the pulse generation circuit;
 wherein:
  the generated dummy current pulses are configurable for use in controlling supply variations during processing of input data for serializer/deserializer (SerDes) transmission;
  the one or more control elements are arranged to control generation of dummy current pulses via the one or more dummy load cells based on the one or more input signals; and
  the one or more input signals comprise at least one signal corresponding to the input data.

2. The system of claim 1, wherein the one or more control elements comprise one or more of n-channel transistors and p-channel transistors.

3. The system of claim 1, wherein the one or more control elements comprise one or more inverters.

4. The system of claim 1, wherein the pulse generation circuit is configured to generate the dummy current pulses to eliminate or reduce supply variations during processing of the input data.

* * * * *